United States Patent [19]

Matsumoto et al.

[11] Patent Number: 4,814,846
[45] Date of Patent: Mar. 21, 1989

[54] PHOTOELECTRIC CONVERTING DEVICE

[75] Inventors: Shigeyuki Matsumoto; Shigetoshi Sugawa, both of Atsugi, Japan

[73] Assignee: Canon Kabushiki Kaisha, Tokyo, Japan

[21] Appl. No.: 869,885

[22] Filed: Jun. 3, 1986

[30] Foreign Application Priority Data

Jun. 12, 1985 [JP] Japan .................................. 60-126284

[51] Int. Cl.⁴ ...................... H01L 27/14; H01L 31/00
[52] U.S. Cl. ........................................ 357/30; 357/34; 357/35; 357/40; 357/43; 357/45; 357/47; 357/50
[58] Field of Search ................ 357/30 D, 30 G, 30 H, 357/30 P, 30 Q, 34, 35, 23.6, 23.1, 43, 45, 47, 40, 50, 51

[56] References Cited

U.S. PATENT DOCUMENTS

| | | | |
|---|---|---|---|
| 3,532,945 | 10/1970 | Weckler | 357/13 |
| 3,911,269 | 10/1975 | Hart | 250/211 J |
| 4,450,466 | 5/1984 | Nishizawa | 357/30 |
| 4,686,554 | 8/1987 | Ohmi et al. | 357/30 |

FOREIGN PATENT DOCUMENTS 132076 1/1985 European Pat. Off. .

Primary Examiner—William L. Sikes
Assistant Examiner—Georgia Y. Epps
Attorney, Agent, or Firm—Fitzpatrick, Cella, Harper & Scinto

[57] ABSTRACT

A photoelectric converting device is provided with photoelectric converting cells. Each cell is provided with a semiconductor transistor and a capacitor. The transistor is composed of two main electrode semiconductor areas of a first type and a control electrode semiconductor area of opposite conductivity type. The capacitor controls the potential of said control electrode area in a floating state. The cell is capable of an accumulating operation for accumulating photo-induced carriers in said control electrode area, a read-out operation for reading an output controlled by a voltage generated by said accumulation, and a refreshing operation for dissipating the carriers accumulated in said control electrode area, by means of controlling the potential of said control electrode area in floating state through said capacitor. The device comprises a semiconductor area of a high concentration and of the same conductive type as that of said control electrode area in an element islation area which is provided in said main electrode area for electrically isolating said photoelectric converting cells, thereby constituting a transistor structure in combination with said control electrode area.

2 Claims, 9 Drawing Sheets

PHOTOELECTRIC CONVERTING DEVICE

BACKGROUND OF THE INVENTION

1. Field of the Invention

The present invention relates to a photoelectric converting device capable of accumulating photo-excited carriers and controlling output by thus accumulated voltage.

2. Related Background Art

FIG. 1(A) is a plan view of a photoelectric converting device disclosed in the European Patent Application Laid-open No. 132076, FIG. 1(B) is a cross-sectional view along a line I—I therein, and FIG. 1(C) is an equivalent circuit diagram of a photosensor cell.

In these drawings there are shown photo-sensor cells arranged on an n-silicon substrate 101, and each photosensor cell is electrically insulated from neighboring cell by a separating area 102 composed of $SiO_2$, $Si_3N_4$ or polysilicon.

Each photosensor cell is constructed in the following manner.

On an n-type area 103 with a low impurity concentration formed for example of an epitaxial process, there is doped a p-type impurity to form a p-type area 104, in which there is formed an $n^+$-type area by impurity diffusion or ion implantation. The p-type area 104 and $n^+$-type area 105 respectively constitute a base and an emitter of a bipolar transistor.

On such n-type area 103, including the above-mentioned other areas, there also formed an oxide layer 106 on which provided a capacitor electrode 107 of a determined area. Said capacitor electrode 107 faces the p-type area 104 across the oxide layer 106 to constitute a capacitor $C_{ox}$. The potential of the floating p-type area 104 is controlled by the application of a pulse voltage to said capacitor electrode 107

There are further formed an emitter electrode 108 connected to the $n^+$-type area 105, a wiring 109 for reading the signal from the emitter electrode 108, a wiring 110 connected to the capacitor electrode 107, an $n^+$-type area 111 of a high impurity concentration formed on the rear side of the substrate 101, and an electrode 112 for providing a potential to the collector of the bipolar transistor.

In the following, there will be explained the basic function of the define. It is assumed that the p-type area 104, constituting the base of the bipolar transistor, is at a negative initial potential. When light 113 enters said p-type area 104, a charge corresponding to the amount of light is accumulated therein (accumulating step). The base potential varies by the thus accumulated charge, and the emitter-collector current is controlled by said potential variation. Thus, an electrical signal, corresponding to the amount of incident light, is read from the floating emitter electrode 108 (read-out step). For eliminating the charge accumulated in the p-type area 104, the emitter electrode 108 is grounded and a refreshing positive pulse is applied t the capacitor electrode 107. Said application of positive voltage creates a forward bias for the p-type area 104 with respect to the $n^+$-type area 105, whereby the accumulated charge is eliminated. At the end of said refreshing pulse, the p-type area 104 returns to the initial negative potential state (refreshing step). Thereafter the above-described accumulation, readout and refreshing steps are repeated.

In summary, the above-described device is to accumulate the charge, generated by incident light, in the p-type area 104 constituting the base and to control the current flowing between the emitter 108 and the collector 112 by the thus accumulated charge. Consequently the accumulated charge is read after amplification by each cell, and it is rendered possible to achieve a high output, a high sensitivity and a low noise level.

The potential Vp generated in the base by the holes accumulated therein by photoexcitation is given by Q/C, wherein Q is the amount of charge accumulated in the base while C is the capacity connected to the base. As will be apparent from this equation, the potential Vp generated by photoexcitation remains almost constant in case of a high degree of integration since Q and C become smaller with the reduction in cell size. Consequently the above-described method is advantageous also for achieving a high resolution in the future.

On the other hand, the change in the base potential Vb during the application of the refreshing positive voltage in the refreshing step can be determined from the following equation:

$$(C_{ox} + C_{be} + C_{bc}) \frac{dV_b}{dt} = -I_b$$

Wherein $C_{be}$ is the base-emitter capacity, $C_{bc}$ is the base-collector capacity, and $I_b$ is the base current.

FIG. 2 shows the time-dependent change of the base potential Vb during the application of the refreshing positive voltage.

In this chart, the initial base potential at the start of application of the refreshing pulse depends on the magnitude of the accumulated voltage Vp, since the application of a refreshing positive pulse to the capacitor electrode 107, in a state in which the initially negative base potential has been elevated by an accumulated voltage Vp in the accumulating step, elevates the initial base potential by said accumulated voltage Vp.

Also as shown in said chart, the time of retention of the initial base potential varies according to the magnitude of said initial base potential, but, after the lapse of said time, the base potential Vb lowers in the same manner regardless of the initial base potential. Consequently, if the refreshing time t is sufficiently long, the base potential Vb can be reduced almost to zero regardless of the magnitude of the accumulated voltage Vp, so that the base potential Vb can be returned to the initial negative state at the end of the refreshing pulse.

In practice, however, in order to achieve a high-speed operation, the refreshing operation is completed when the base potential Vb reaches a value Vk at a refreshing time $t = t_0$. Even if the base potential Vb has a certain retentive value, it is possible to reduce the base potential Vb to a constant negative potential at the end of the refreshing pulse if the base potential Vb is always equal to the value Vk at the refreshing time $t = t_0$, and to take said negative potential as the initial state.

However, in the conventional photoelectric converting device, there will result a progressive lowering of the retentitive potential Vk by repeated refreshing operations, thus resulting in an after-image effect.

As an example, it is assumed, in FIG. 2, that the initial base potentials are 0.8V and 0.4V respectively in a high-intensity illuminated cell and a low-intensity illuminated cell. After the lapse of the refreshing time $t_0$, the base potential Vb of the former cell reaches the determined retentive potential Vk but that of the latter cell reaches a potential Vl lower than Vk. If the refreshing pulse is terminated at this point, the base potential Vb of the low-intensity illuminated cell becomes lower than the initial negative potential, and the accumulating and read-out steps are initiated from said lower potential. Thus, if the refreshing operation is repeated under a low illumination intensity, the retentive base potential gradually lowers, so that there can be obtained an output lower than that corresponding to the amount of incident light even after receiving a high illumination intensity in this state. In this manner there results an afterimage effect.

Such phenomenon is presumably due to the deficiency in positive holes caused by recombination in the base area induced by repeated refreshing operations. Consequently the afterimage effect becomes apparent if a low illumination state continues where the deficient positive holes cannot be replenished.

SUMMARY OF THE INVENTION

An object of the present invention is to provide an improvement on the conventional photoelectric converting device.

Another object of the present invention is to provide an improved photoelectric converting device in which the afterimage effect is absent or remains in the practically permissible level even after high-speed operation is repeated.

Still another object of the present invention is to provide a photoelectric converting device capable of properly functioning without afterimage phenomenon over a wide range of intensity of illumination.

Still another object of the present invention is to provide a photoelectric converting device provided with photoelectric converting cells each of which is provided with a semiconductor transistor composed of two main electrode areas of a first conductivity type and a control electrode area of an opposite conductivity type, and a capacitor for controlling the potential of said control electrode area maintained in a floating state, and is capable of an accumulating operation for accumulating photo-induced carriers in said control electrode area, a read-out operation for reading an output controlled by the accumulated voltage generated by said accumulating operation, and a refreshing operation for dissipating the carriers accumulated in said control electrode area, through the control of the potential of said control electrode area in floating state by means of said capacitor, wherein a semiconductor of a high impurity concentration of a conductive type the same as that of said control electrode area is provided in an element isolation area, provided in said main electrode area for electrically isolating said photoelectric converting cells, thereby forming a transistor structure with said control electrode area.

DETAILED DESCRIPTION OF THE PREFERRED EMBODIMENTS

Now the present invention will be clarified in detail by embodiments thereof shown in the attached drawings.

Figure 3A:
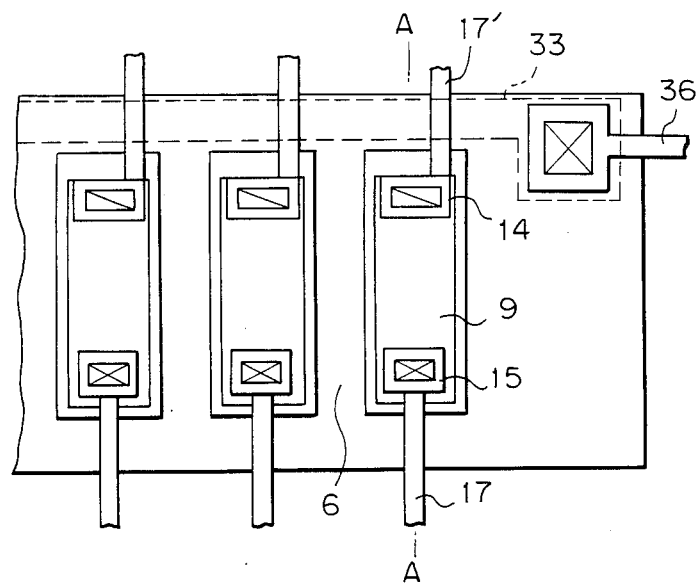
FIG. 3(A) is a plan view of a photoelectric converting device of the present invention.
Figure 3B:
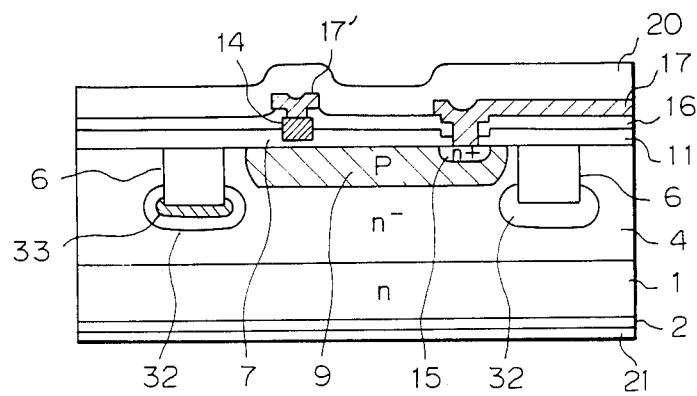
FIG. 3(B) is a cross-sectional view of a cell thereof along a line A—A.
Figure 3C:
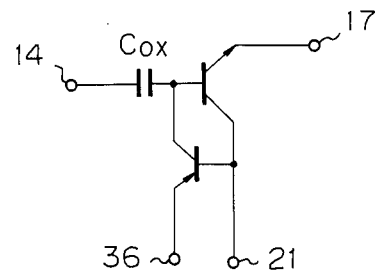
FIG. 3(C) is an equivalent circuit diagram of said cell.

FIG. 3(A) is a plan view of an embodiment of the photoelectric converting device of the present invention, while FIG. 3(B) is a cross-sectional view of a cell thereof along a line A—A, and FIG. 3(C) is an equivalent circuit diagram of said cell.

As shown in these drawings, on an n-type silicon substrate 1, there is formed an $n^-$-type epitaxial layer 4 in which photosensor cells are arranged mutually separated by an element separating area 6.

Each photosensor cell is composed of a p-type base area 9 of a bipolar transistor formed on the $n^-$-type epitaxial layer 4; an $n^+$-type emitter area 15; a polysilicon capacitor electrode 14 for applying a pulse to the p-type base area 9 across an oxide layer 7; an electrode 17 connected to the $n^+$-type emitter area 15; an electrode 17' connected to the capacitor electrode 14; an $n^+$-type area 2 of an elevated impurity concentration formed on the rear side of the substrate 1; and an electrode 21 for providing a potential to the collector of the bipolar transistor.

Under a part of the separating area 6 there is embedded a $p^+$-type area 33 facing the $n^-$-type epitaxial layer 4 across an $n^+$-type area 32. The $p^+$-type area 33 is used for injecting positive holes into the p-type base area 9 as will be explained later, and constitutes a transistor in combination with the p-type base area 9 and $n^-$-type epitaxial layer 4. The $p^+$-type area 33 receives a voltage through an electrode 36. The $n^+$-type area 32 is provided for preventing punch-through phenomenon.

The above-explained structure, capable of elevating the potential of the control electrode area by carrier injection thereto, allows the device to have a sufficiently high potential of the control electrode area at the start of the aforementioned refreshing operation and to therefore attain a desired constant potential in the control electrode area at the end of the refreshing operation. In addition, the presence of the above-mentioned semiconductor area in the separating area allows prevention of the afterimage effect without sacrificing the photoelectric converting efficiency.

In the following said control electrode area will be referred to as the p-base area, the main electrode area including said semiconductor area as $n^-$-collector area, and the semiconductor area as $p^-$-area. If the potential of said $p^+$-area is elevated close to the collector potential, a transistor function is induced among the $p^+$-area, $n^-$-collector area and p-base area whereby positive holes are injected from the $p^+$-area to the p-base area to elevate the potential of the latter. This operation is conducted immediately before the refreshing operation. Thus, the refreshing operation can be initiated from a high initial base potential, and the potential of the p-base area reaches a determined value after a determined refreshing time, regardless of the magnitude of the intensity of incident light. Besides the photoelectric converting efficiency is not lost since the $p^+$-area is formed in or under the separating area which is not involved in the photoelectric converting operation.

In the following there will be given an explanation on the basic function of the present embodiment shown in FIGS. 3(A) to 3(C).

At first, the p-base area 9 of a negative potential is maintained in floating state, and positive holes of electron-hole pairs generated by light are accumulated in said area 9 (accumulating operation).

Then a positive is supplied to the capacitor electrode 14 to apply a forward bias between the emitter and base, in order to read, through the floating emitter, an output controlled by the accumulated voltage generated by the accumulated holes (reading operation.) The change $\Delta Vb$ in the potential of the p-base area 9 caused by the supply of a voltage Vr to the capacitor electrode 14 is determined by the following equation:

$$\Delta Vb = \alpha Vr$$

wherein $\alpha = Cox/(Cox + Cbe + Cbc)$.

Subsequently a positive voltage is supplied to the electrode 36 to turn on a pnp transistor composed of the $p^+$-type area 33, $n^-$-type epitaxial layer 4 and p-type base area 9, thereby injecting positive holes from said area 33 to the base area 9. In this manner, the potential of the p-type base areas 9 in all the cells is elevated (hole injecting operation).

Then, the emitter is grounded, and a positive refreshing pulse is supplied to the capacitor electrode 14 thereby eliminating the holes accumulated in the p-type base area 9 to the emitter (refreshing operation). In this state, since the potential of the p-type base area 9 has been elevated by positive hole injection, the initial base potential immediately after the application of the refreshing pulse becomes sufficiently higher than the retentive potential Vk even in a cell maintained in dark (cf. FIG. 2). Consequently, after the lapse of a refreshing time $t_0$, the potential of the p-type base area 9 becomes equal to a constant value Vk regardless of the intensity of illumination. The refreshing positive pulse is terminated in this state, so that the p-type base areas 9 in all the cells reach an initial state of a determined negative potential.

The insertion of the positive hole injecting operation in this manner prevents the deficiency of positive holes in the p-type base area 9 even after the refreshing operation is repeated, and the afterimage phenomenon in the low-intensity illumination can be completely avoided.

In the following, there will be explained an embodiment of an imaging device composed of a linear array of photosensor cells of the structure and basic function as explained above.

Figure 4:
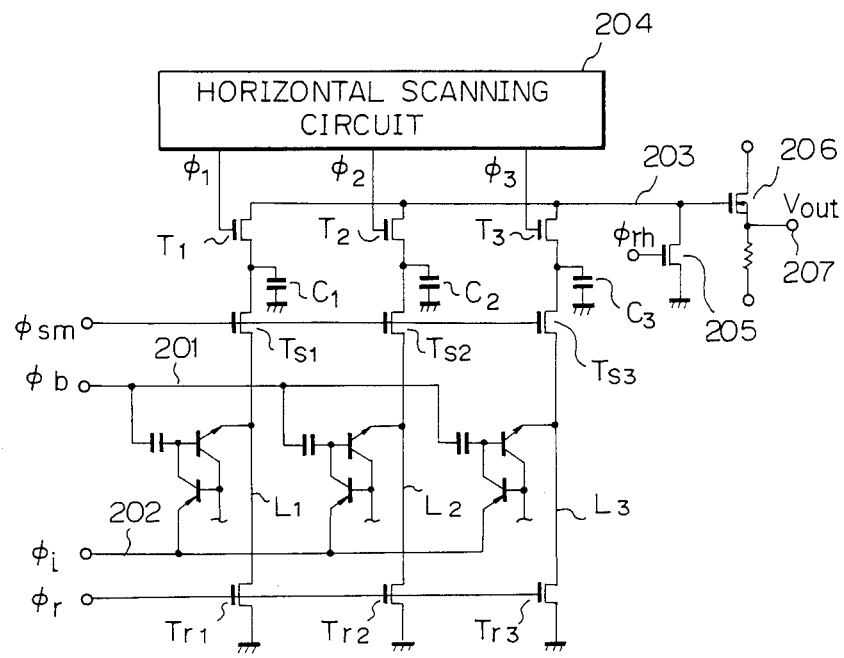
FIG. 4 is a circuit diagram of an imaging device in which the photosensor cells of the foregoing embodiment are linearly arranged.

FIG. 4 is a circuit diagram of an imaging device composed of a linear array of photosensor cells of said embodiment.

In FIG. 4, the linear array contains three photosensor cells, and collector electrodes 21 thereof are commonly connected and receive a determined positive voltage. The capacitor electrode 14 of each photosensor cell is connected to a horizontal line 201 for applying a reading or refreshing pulse $\phi b$. The electrodes 36 of the photosensor cells are commonly connected to a driving line 202 for receiving a signal $\phi i$ of a voltage Vi which is equal to or slightly lower than the collector voltage supplied to the electrode 21.

The emitter electrodes 17 of the photosensor cells are connected to vertical lines L1–L3 for signal read-out, which are respectively connected, through transistors Ts1–Ts3, to capacitors C1–C3 and transistors T1–T3. Other terminals of said capacitors C1–C3 are grounded, and other main electrodes of the transistors T1–T3 are commonly connected to an output signal line 203. The gate electrodes of the transistors Ts1–Ts3 receive a signal $\phi sm$ for simultaneously opening or closing the vertical lines. Also the gate electrodes of the transistors T1–T3 are connected to parallel output terminals of a horizontal scanning circuit 204, and the capacitors C1–C3 are connected in succession with the output signal line 203 by signals $\phi 1$–$\phi 3$ released from said parallel output terminals.

The emitter electrodes 17 are grounded through transistors Tr1–Tr3, of which gate electrodes receive a signal $\phi r$.

The output signal line 203 is grounded through a refreshing transistor 205, of which gate electrode receives a signal $\phi rh$. The output signal line 203 is also connected to the gate electrode of a signal amplifying transistor 206, and the amplified signal is released through an output terminal 207.

In the following there will be given an explanation of the imaging device of the above-explained structure.

Figure 5:
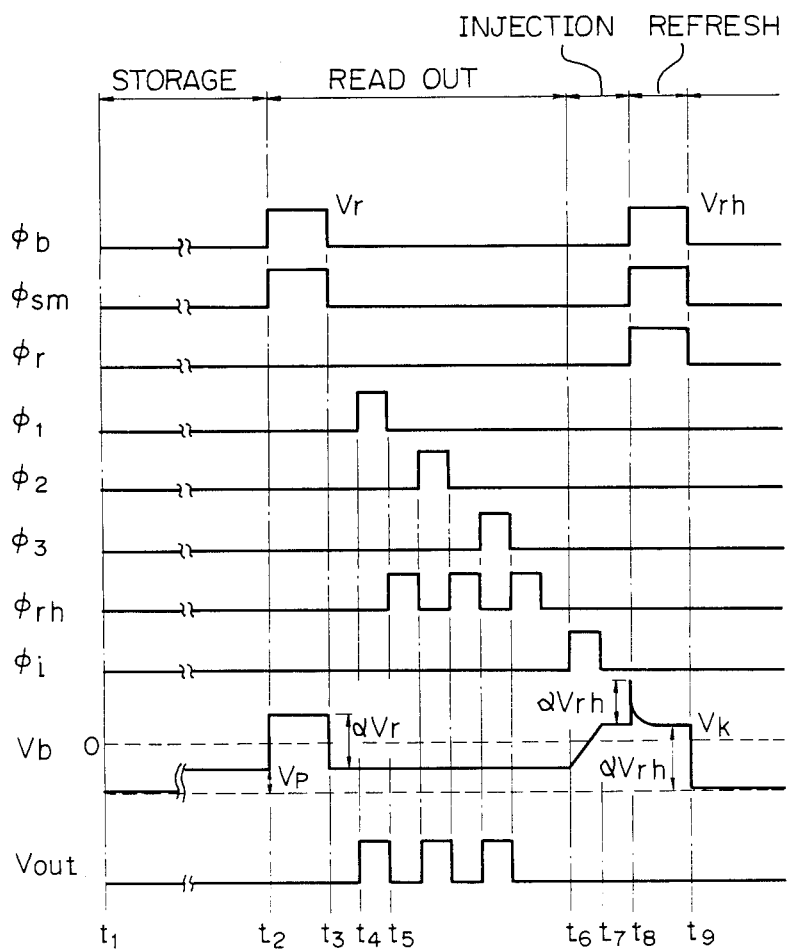
FIG. 5 is a waveform chart showing the function of said imaging device.

FIG. 5 is a waveform chart showing the function of said imaging device.

At first the accumulating operation is initiated from a time t1 where the base potential Vb assumes an initial negative value. In response to the amount of light received in a period from t1 to t2, positive holes of a corresponding amount are accumulated in the base area 9 of each photosensor cell, so that the base potential Vb is elevated by the accumulated voltage Vp.

At a time t2, the signal $\phi b$ is elevated to the voltage Vr, so that the signal $\phi sm$ assumes the high level state to initiate the read-out operation. At first, in response to the high level state of the signal $\phi sm$, the transistors Ts1–Ts3 are turned on to connect the emitter electrodes 17 of the photosensor cells respectively to the capacitors C1–C3. Also the voltage Vr is supplied through the horizontal line 201 to the capacitor electrodes 14 of the photosensor cells, whereby the base potential Vb is varied by $\alpha Vr$ in the positive direction to conduct the above-explained read-out operation. More specifically a read-out current corresponding to the accumulated voltage Vp of each photosensor cell flows between the collector and emitter, so that charges corresponding to the amounts of incident light to the photosensor cells are accumulated on the capacitors C1–C3.

At a time t3, the signals $\phi b$ and $\phi sm$ are terminated to turn off the transistors Ts1–Ts3, whereby the base potential Vb returns to a negative potential same as that immediately before the time t2.

Subsequently, at a time t4, the signal $\phi 1$ of the horizontal scanning circuit 204 is shifted to a high level state to turn on the transistor T1, whereby the charge accumulated in the capacitor C1 corresponding to the amount of incident light is read through the output signal line 203. The voltage generated in said signal line 203 is amplified by the transistor 206 and release an output signal Vout from the output terminal 207.

After the read-out of the charge accumulated in the capacitor C1, the signal $\phi 1$ is terminated at a time t5 to turn off the transistor T1. Simultaneously the signal $\phi rh$ is shifted to a high level state to turn on the transistor 205, whereby the charge read to the output signal line 203 is eliminated through said transistor 205.

Similar operations are thereafter conducted until a time t6 in response to signals $\phi 2$, $\phi 3$ of the horizontal scanning circuit 204 and a signal $\phi rh$, whereby the charges accumulated in the capacitors C2, C3 are transferred in succession to the output signal line 203 and released from the output terminal 207 after amplification by the transistor 206.

After completion of the read-out operations for all the photosensor cells, the signal $\phi i$ is shifted to a positive voltage Vi from a time t6 to t7, and is supplied to the electrodes 36 of the photosensor cells through the driving line 202. As the result, as already explained before, positive holes are injected in the base areas 9 of the cells to elevate the base potential Vb. As already explained in relation to FIG. 6, the amount of rise of the base potential Vb has to be selected in such a manner that the initial base potential of the low-intensity illuminated photosensor cell becomes sufficiently higher than a given retentive potential Vk.

Subsequently, at a time t8, the signal $\phi b$ is elevated to the refreshing positive voltage Vrh, and the signals $\phi sm$ and $\phi r$ assume a high level state. The signal $\phi r$ in high level state turns on the transistors Tr1-Tr3 whereby the emitter electrodes 17 of the photosensor cells are grounded. Also the signal $\phi sm$ in high level state turns on the transistors Ts1-Ts3, thereby grounding the capacitors C1-C3 and the vertical lines L1-L3.

Figure 1A:
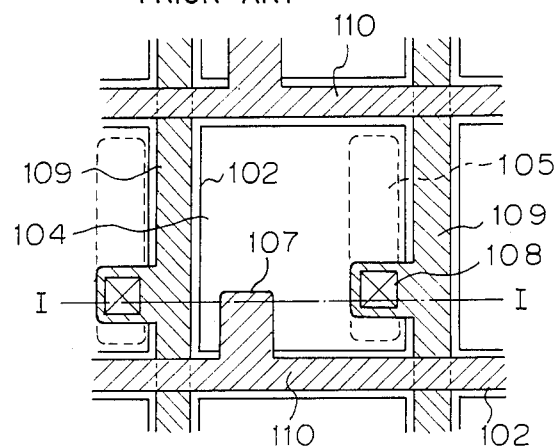
FIG. 1(A) is a plan view of a conventional photoelectric converting device.
Figure 1B:
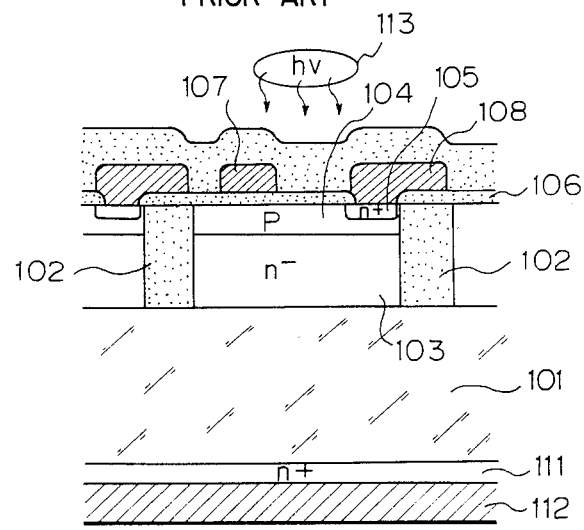
FIG. 1(B) is a cross-sectional view along a line I—I therein.
Figure 1C:
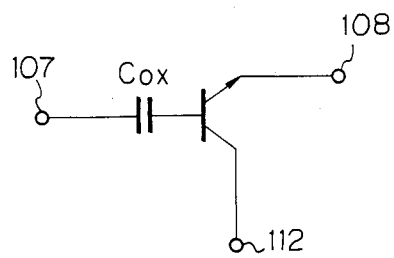
FIG. 1(C) is an equivalent circuit diagram of a photosensor cell thereof
Figure 2:
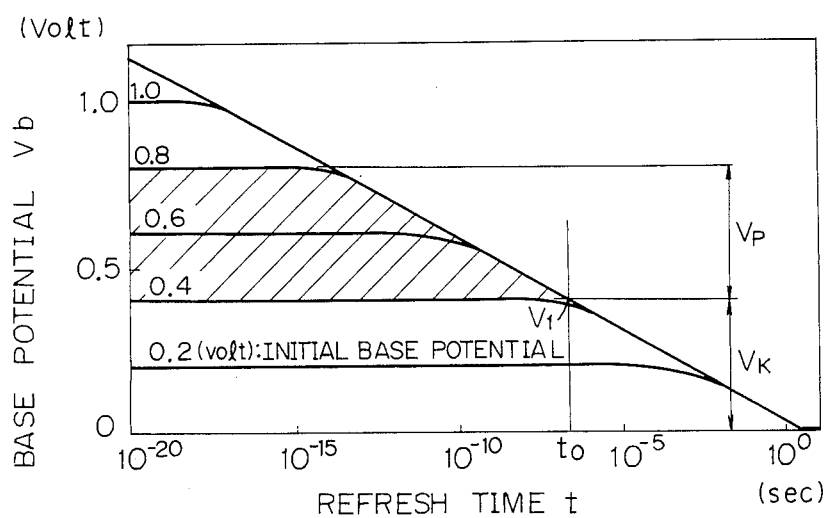
FIG. 2 is a chart showing the time-dependent change of the base potential Vb during the application of a refreshing positive voltage to the conventional photoelectric converting device shown in FIGS. 1(A)–1(C)

The application of the refreshing positive voltage Vrh to the capacitor electrodes of the cells elevates the base potentials Vb by $\alpha$Vrh to the initial base potential, whereby the accumulated positive holes are dissipated by recombination. Thus the base potential Vb is lowered with the lapse of time as shown in FIG. 2. At a time t9 when the base potential reaches the retentive potential Vk, the signal $\phi b$ is terminated to return the base potential to the initial negative potential Vk - $\alpha$Vrh. Thereafter, the operations of accumulation, read-out, positive hole injection and refreshing are repeated in the same manner.

As explained in the foregoing, the injection of positive holes into the base area immediately before the refreshing operation allows to sufficiently elevate the initial base potential in the refreshing operation, so that the base potential at the start of accumulating operation can be maintained constant regardless of the intensity of illumination. Consequently the afterimage phenomenon in the conventional device can be completely prevented.

Now reference is made to FIGS. 6(A) to 6(J) for explaining the process of manufacture of the photoelectric converting device shown in FIGS. 3(A) to 3(C).

Figure 6A:
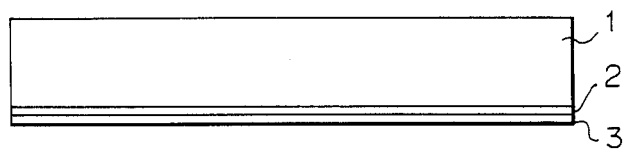
FIGS. 6(A) to 6(J) are views showing the process of manufacturing the foregoing embodiment.
Figure 6B:
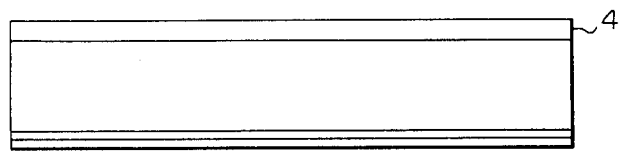

At first, as shown in FIG. 6(A), on the rear face of an n-type silicon substrate 1 with an impurity concentration of $1\times 10^{15} - 5\times 10^{18}$ cm$^{-3}$, there is formed an n$^+$-type layer 2 for ohmic contact with an impurity concentration $1\times 10^{17} - 1\times 10^{20}$ cm$^{-3}$ by the diffusion of P, As or Sb. Subsequently an oxide layer 3, for example of SiO$_2$, of a thickness of 3,000 to 7,000 Å is formed by CVD process on the n$^+$-type layer 2.

The oxide layer 3 is called a back coating, and prevents the formation of impurity vapor at the heat treatment of the substrate 1.

Then the surface of the substrate 1 is etched for ca. 1.5 minutes at 1,000° C. with HCl at a rate of 2 l./min. and H$_2$ at a rate of 60 l./min., and the n-type epitaxial layer 4 (hereinafter called n-layer 4) is formed at a temperature of 1,000° C. and a reduced pressure of 120-180 Torr, with supply of a source gas (SiH$_2$Cl$_2$, 100%) at a rate of 1.2 l./min. and 100 cc of a doping gas (PH$_3$ diluted with H$_2$, 20 ppm). The monocrystal growth rate is 0.5 $\mu$m/min., the thickness is in a range from 2 to 10 $\mu$m, and the impurity concentration is in a range from $1\times 10^{12}$ to $10^{16}$ cm$^{-3}$, preferably from $10^{12}$ to $10^{14}$ cm$^{-3}$ (cf. FIG. 6(B)).

Subsequently the separating area 6 is formed for example by selective oxidation, grooved selective oxidation, groove embedding, or selective epitaxy etc. In the following there will be explained, as an example, the groove embedding method.

Figure 6C:
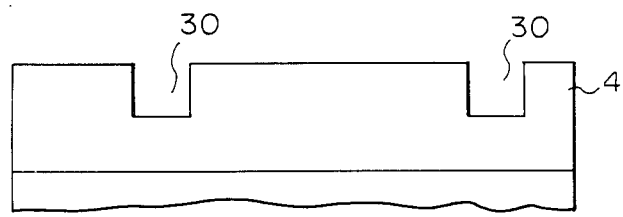
Figure 6D:
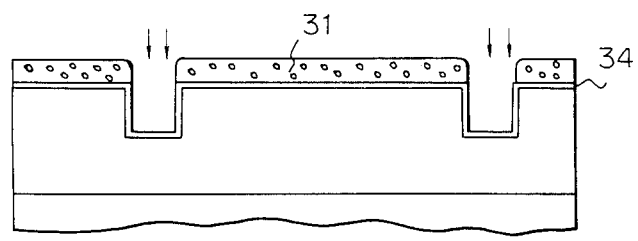
Figure 6E:
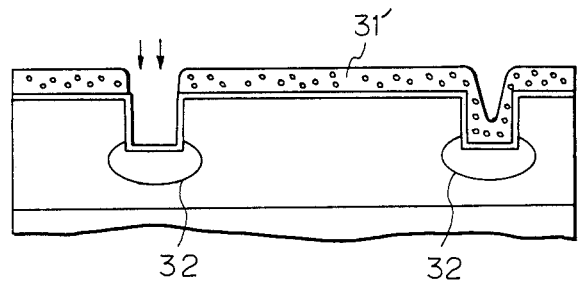
Figure 6F:
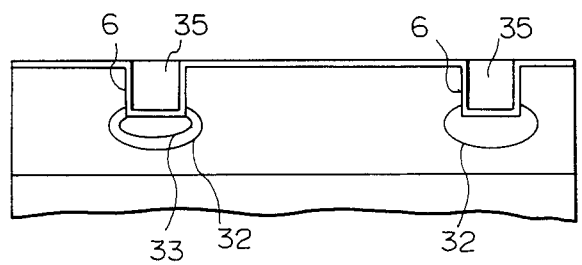

At first the n-layer 4 is selectively etched for example by reactive ion etching to form a groove 30 (cf. FIG. 6(C)).

Then the n-layer 4 is covered with an oxide layer 34, and a resist layer 31 is formed by patterning in areas other than the grooves 30. Subsequently ions of an n-type impurity are injected into the bottom of the groove 30, while said resist layer 31 is used as the mask. In case of injecting phosphor ions, a satisfactory result could be obtained with a dose of $1\times 10^{12}$ to $5\times 10^{14}$ cm$^{-2}$ and an accelerating voltage of 60-120 kV (FIG. 6(D)).

Then the resist 31 is stripped, and a heat treatment is conducted in an atmosphere of nitrogen to diffuse the n-type impurity to a determined depth, thus forming the n$^+$-type area 32. Subsequently a resist layer 31' is formed by patterning in an area excluding a groove 30, and, ions of a p-type impurity are injected into the bottom of a groove 30 only. In case of injecting boron ions, a satisfactory result could be obtained with a dose of $1\times 10^{13}$ to $5\times 10^{15}$ cm$^{-2}$ and an accelerating voltage of 25 to 80 kV (cf. FIG. 6(E)).

Then the resist 31' is stripped, and a heat treatment is conducted in an atmosphere of nitrogen to diffuse the p-type impurity to a determined depth, thus forming the p$^+$-type area 33. Said area 33 has to be entirely covered by the n$^+$-type area 32. Said area 32 is provided for preventing the putch-through effect of the transistor composed of the p$^+$-area, n$^-$-area and p-base area, and may be dispensed with under certain conditions. Subsequently the grooves 30 are filled with polysilicon 35 or SiO$_2$, and the surface is flattened by etching from the surface to obtain the separating area 6 (FIG. 6(F)).

Figure 6G:
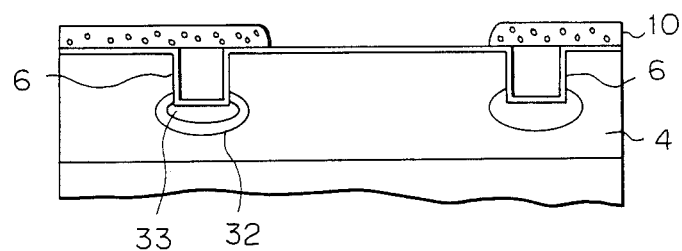

Then a resist 10 is coated, and an area to become the base is selectively removed (FIG. 6(G)).

Subsequently ions of B$^+$ or BF$_2^+$ generated from BF$_3$ are implanted, with a surface concentration in a range from $1\times 10^{15}$ to $5\times 10^{18}$ cm$^{-3}$, preferably from $1\times 10^{16}$ to $20\times 10^{16}$ cm$^{-3}$, and with an amount of ions from $7\times 10^{11}$ to $1\times 10^{15}$ cm$^{-2}$, preferably from $1\times 10^{12}$ to $1\times 10^{14}$ cm$^{-2}$.

After said ion implantation, the resist layer 10 is stripped, and a thermal diffusion is conducted at 1,000°-1,100° C. in a nitrogen atmosphere to form the p-type base area 9 to a determined depth and to a thick oxide layer 11 on the surface of the substrate 1.

The base area 9 may also be formed by placing BSG on the wafer and diffusing the impurity B to a determined depth by thermal diffusion at 1,100° to 1,200° C.

Figure 6H:
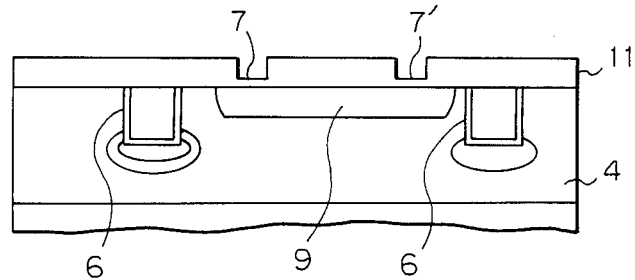

After the formation of the separating area 6 and the base area 9 in this manner, the oxide layer 11 is selectively removed in the areas where the capacitor electrode and the emitter electrode are to be formed, and oxide layers 7, 7' of a thickness of 100 to 1,000 Å are respectively formed in thus obtained apertures (FIG. 6(H)).

Thereafter As-doped polysilicon is deposited by a CVD process with $N_2+SiH_4+AsH_3$ or $H_2+SiH_4+AsH_3$, at a temperature of 550°–900° C., with a thickness of 2,000 to 7,000 Å. It is naturally possible to deposit non-doped polysilicon by CVD and to diffuse As or P thereafter. The polysilicon layer thus formed is partially etched by a photolithographic process to form the capacitor electrode 14 composed of polysilicon.

Figure 6I:
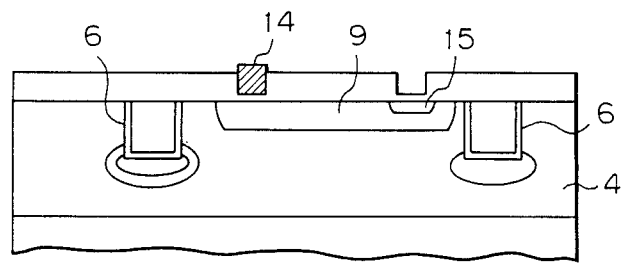
Figure 6J:
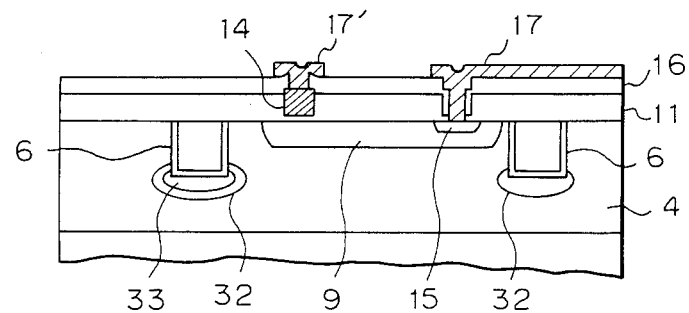

Subsequently the n+-type emitter area 15 is formed by implanting ions of an impurity such as P or As through the oxide layer 7' followed by thermal treatment (FIG. 6(I)).

Instead of ion implantation, the emitter area 15 may also be formed by removing the oxide layer 7', depositing polysilicon in thus obtained aperture simultaneously with the deposition of polysilicon 14, and diffusing the impurity in polysilicon such as P or As into the p-type base area 9 by thermal treatment.

Subsequently an insulating layer 16 composed of PSG or $SiO_2$ of a thickness of 3,000–7,000 Å0 is deposited by the above-mentioned gaseous CVD process, and contact holes are opened on the capacitor electrode 14 and the emitter area 15 through masking and etching. In said contact holes the electrodes 17 of a metal such as Al, Al-Si or Al-Cu-Si are deposited by vacuum evaporation or sputtering (FIG. 6(J)).

Finally a passivation layer 20 (PSG or $Si_3N_4$) is formed for example by CVD process, and the electrode 21 composed of a metal such as Al, Al-Si or Au is formed on the rear face of the wafer to obtain the photoelectric converting device shown in FIGS. 3(A) and 3(B).

In the foregoing embodiment, the separating area is composed of an insulator embedded in a groove, but other separating methods can naturally be utilized also as will be explained in the following.

Figure 7:
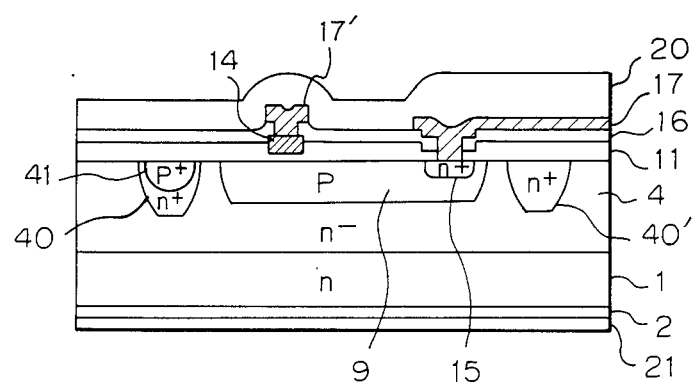
FIG. 7 is a schematic cross-sectional view of another embodiment of the present invention.

FIG. 7 is a schematic cross-sectional view of another embodiment of the present invention, wherein same components as those in FIG. 3 are represented by same numbers and are omitted in the following description.

In the embodiment shown in FIG. 7, n+-type areas 40, 40' are formed for example by diffusion as the element separating areas, and a p+-type area 41 is formed in the separating area 40. In the present embodiment, the injection of positive holes is conducted by a pnp transistor composed of the p+-type area 41, n⁻-type layer 4 and p-type base area 9.

The foregoing description has been limited to a photoelectric converting device containing a linear array of photosensor cells, but the present invention is applicable also to a single photosensor cell or plural cells arranged two-dimensionally.

As detailedly explained in the foregoing, the photoelectric converting device of the foregoing embodiments is featured by the presence of a semiconductor of a high impurity concentration and of a same conductive type as that of the control electrode area, in an element separating area present in the main electrode area in order to electrically separate photoelectric converting cells, thereby forming a transistor structure with said control electrode area.

Consequently, in these embodiments, it is rendered possible to inject the carriers in the control electrode area to elevate the potential thereof, thereby sufficiently elevating the potential of the control electrode area at the start of the refreshing operation and thus attaining a desired constant potential at the control electrode area at the end of the refreshing operation. In addition, since said semiconductor area is provided in said separating area, the afterimage phenomenon can be completely prevented without sacrificing the photoelectric converting efficiency.

What is claimed is:

1. A photoelectric converter for providing an output signal which varies as a function of light energy received thereby, said converter having:
   a plurality of phototransistors comprising a pair of semiconductor regions of a first conductivity type, and a control semiconductor region of a conductivity type opposite to the first conductivity type and adapted for accumulation of carriers responsive to the received light energy;
   an element isolation region provided within one of said pair of semiconductor regions for isolating said plurality of phototransistors; and
   a plurality of additional transistors associated with said plurality of phototransistors and provided directly under and touching said element isolation region, each of said additional transistors comprising a semiconductor region of the first conductivity type, said control semiconductor region, and said one of said pair of semiconductor regions.

2. A photoelectric converter for providing an output signal which varies as a function of light energy received thereby, said converter having:
   a plurality of phototransistors comprising a pair of semiconductor regions of a first conductivity type, and a control semiconductor region of a second conductivity type opposite to the first conductivity type and adapted for accumulation of carriers responsive to the received light energy;
   an element isolation region for isolating said plurality of phototransistors, said element isolation region comprising a semiconductor region of the first conductivity type and provided within one of said pair of semiconductor regions; and
   a plurality of additional transistors associated with said plurality of phototransistors, each of said additional transistors comprising a semiconductor region of the second conductivity type, said control semiconductor region, and said one of said pair of semiconductor regions.

* * * * *